United States Patent [19]

Schneider

[11] Patent Number: 4,761,623
[45] Date of Patent: Aug. 2, 1988

[54] BROADBAND RFI POWER LINE FILTER

[75] Inventor: Lon M. Schneider, Arlington Heights, Ill.

[73] Assignee: Corcom Inc., Libertyville, Ill.

[21] Appl. No.: 938,020

[22] Filed: Dec. 4, 1986

[51] Int. Cl.⁴ .................. H03H 7/09; H03H 7/06
[52] U.S. Cl. ...................... 333/167; 333/12; 333/177; 333/181; 333/185
[58] Field of Search .......... 333/167, 168, 169, 172, 333/177, 181, 184, 185, 12

[56] References Cited

U.S. PATENT DOCUMENTS

| | | | |
|---|---|---|---|
| 2,221,105 | 11/1940 | Otto | 333/181 |
| 3,065,434 | 11/1962 | Calderhead | 333/167 |
| 3,506,936 | 4/1970 | Loos et al. | 333/181 |
| 3,579,156 | 5/1971 | Parfitt | 333/167 X |
| 3,644,848 | 2/1972 | Kruczek | 333/185 |
| 4,110,715 | 8/1978 | Reindel | 333/185 X |
| 4,342,013 | 7/1982 | Kallman | 333/181 |
| 4,622,526 | 11/1986 | Schneider et al. | 333/181 |
| 4,672,337 | 6/1987 | Thibeault | 333/167 |

FOREIGN PATENT DOCUMENTS 2446714 4/1976 Fed. Rep. of Germany .

OTHER PUBLICATIONS

Sekhri–"Power Line filter", IBM Technical Disclosure Bulletin, vol. 17, No. 7, Dec. 1974; pp. 1998–1999.
Zack—Automatic Electric Mfg. Co., Aemco Relays—Electronics, Dec. 1954—pp. 234–240.

Primary Examiner—Marvin L. Nussbaum

[57] ABSTRACT

A broadband RFI power line filter in which emission filters designed for the 10 KHz to 30 MHz range are combined with high frequency filter elements so as to produce a filter in the 10 KHz to 1000 MHz range. The filter is divided into sections which are constructed in separate electrically isolated compartments so as to increase the attenuation which can be obtained with filters which are not separated from each other and electrically shielded compartments and the level of attenuation which must be achieved from each compartment is reduced in the invention.

4 Claims, 1 Drawing Sheet

BROADBAND RFI POWER LINE FILTER

BACKGROUND OF THE INVENTION

1. Field of the Invention

This invention relates in general to very broadband RFI power line filters and in particular to a novel filter which has high noise attenuation and which can be broken up into subsections so as to increase the attenuation.

2. Description of the Prior Art

Radio frequency interference is unwanted electrical energy in the frequency range generally used for radio communications. Current RFI is propagated by radiation (electromagnetic waves in free space) and by conduction over signal lines and AC power systems.

Power line interference filters are known for the frequency range of 10 KHz to 30 MHz, but RFI power line filters have not generally been available for 10 KHz to the 1000 MHz range.

SUMMARY OF THE INVENTION

The present invention provides a very broadband RFI power line filter operable from 10 KHz to a 1000 MHz which integrates the components of emission filters designed for 10 KHz to 30 MHz with high frequency filter elements so as to provide enhanced performance in the range of 10 MHz to 1000 MHz. Also, the filter of the invention is divided into sections which are constructed in separate electrically isolated compartments. By integration, the high frequency filter elements such as feed through capacitors, feed through filters and dissipative ferrite inductive elements are distributed throughout the emission filter rather than applied as a separate filter attached to or following the emission filter.

The technique of integrating or interleaving the high and low frequency filters provide several benefits. First, providing resistive elements within the emission filter sections reduces the degradation due to spurious resonance in those sections. Also, placing capacitive elements within the filter permits them to work against the "low frequency" filter elements. This results in enhanced performance within the 10 KHz to 30 MHz range as well as in the 30 to 1000 MHz range. This also reduces the need to add additional elements to work against the capacitors as would be required in conventional approaches. Also, it permits the separation of the emission filters into sections each of which include high frequency filtering. In this way, the attenuation required for the entire filter can be broken up into subsections. The value of this division is described hereafter.

The amount of attenuation which can be obtained within an individual filter section enclosure is limited. Leads and components become antennas at medium to high frequencies. These antennas can couple noise around filter elements within a compartment. Thus, performance achieved could be much less than is possible from the elements alone. By dividing the filter into sections which are separated from each other in electrically shielded compartments reduces the level of attenuation which must be achieved from each compartment.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
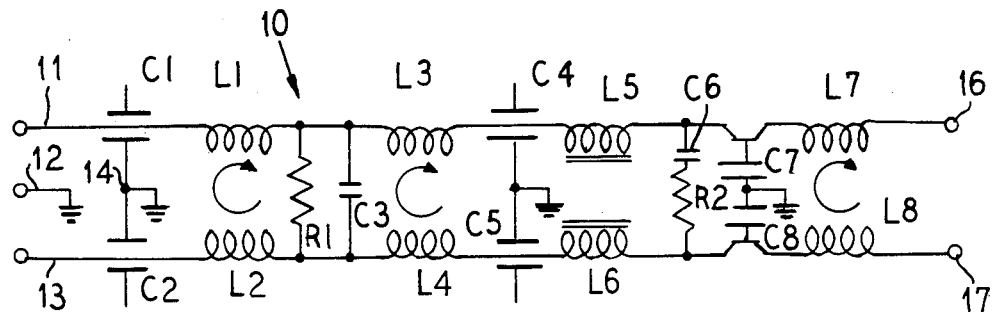
FIG. 1 comprises an electrical schematic of the high frequency filter components of the invention.

FIG. 1 comprises the electrical schematic of the filter according to the invention and the line side comprises a grounded terminal 12 and ungrounded leads 11 and 13. Lead 11 is connected to a capacitor C1 which might be 1000 picofarads which is connected to a first inductance L1 of a toroid inductor. A resistor R1 which might be of 330 kohms is connected from one side of the inductor L1 to the one side of an inductor L2. The other side of the inductor L2 is connected to a capacitor C2 which is connected to lead 13. Capacitor C2 may be 1000 picofarads and the inductors L1 and L2 which are formed on the same toroid may be 0.011 mH. A capacitor C3 which might be 1.5 microfarads is connected in parallel with resistor R1.

A second toroid has a couple of inductive windings L3 and L4 which might be 47.2 mH and have first sides which are connected to opposite sides of the capacitor C3. The second side of the inductor L3 is connected to a capacitor C4 and the second side of the inductor L4 is connected to a capacitor C5. The capacitors C4 and C5 may be 1000 picofarads. The junction point between the capacitors C4 and C5 are connected to ground as is the junction point between the capacitors C1 and C2.

A third toroid inductor comprises inductors L5 and L6 which are, respectively, connected to the capacitors C4 and C5 and may have values of 0.91 microhenries. A capacitor C6 which may be 0.54 microfarads has one side connected to the inductor L5 and the other side connected to a resistor R2 which may be one ohm and which has its other side connected to the inductor L6. A pair of capacitors C7 and C8 have their midpoint connected to ground and are connected in parallel with the capacitor C6 and the resistor R2. The capacitors C7 and C8 may be 0.004 microfarads. A fourth toroid inductor comprises inductances L7 and L8 and the inductance L7 is connected between the capacitor C7 and a load lead 16. The inductor L8 is connected between the capacitor C8 and load terminal 17. The inductors L7 and L8 may be 1.56 mH.

The filter illustrated in FIG. 1 provides high attenuation performance over a frequency range of 10 kHz to 1000 MHz. The components R1, C3, L3, L4, C6, R1, C7, C8, L7 and L8 form components of a prior art RFI emission filter for the range of 10 KHz to 30 MHz and the components C1, C2, L1, L2, C4, C5, L5 and L6 comprise components which are integrated or interleaved with the prior art filter so as to extend it to the 1000 MHz range. The technique of integrating the high and low frequency filters provides several benefits. First, it provides resistive elements within the emission filter sections which reduces degradation due to spurious resonances in those sections. Additionally, placing capacitive elements within the filter permits them to work against the "low frequency" filter elements. This results in enhanced performance within the 1-30 MHz range as well as in the 30-1000 MHz. It also reduces the need to add additional elements to work against the capacitors as would be required in conventional filter approaches. Finally, it also permits the separation of the emission filter into sections each of which include high frequency filtering. In this way, the attenuation required for the entire filter can be broken up into subsections. The value of this division is that the amount of attenuation which can be obtained within the individual filter section enclosures is limited. Leads and components become antennas at medium to high frequencies. These antennas can couple noise around filter elements within a compartment. Thus, performance achieved would be much less than capable from the elements alone. By dividing the filter into sections which are separated from each other in electrically shielding compartments reduces the level of attenuation which must be achieved from each compartment.

Figure 2:
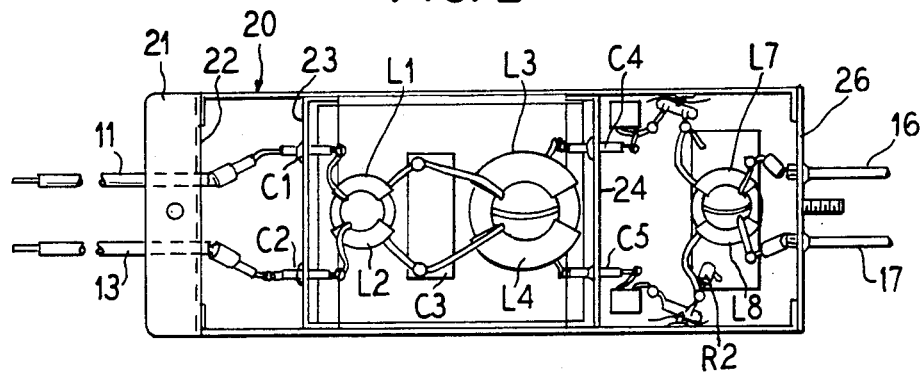
FIG. 2 is a top plan view.
Figure 3:
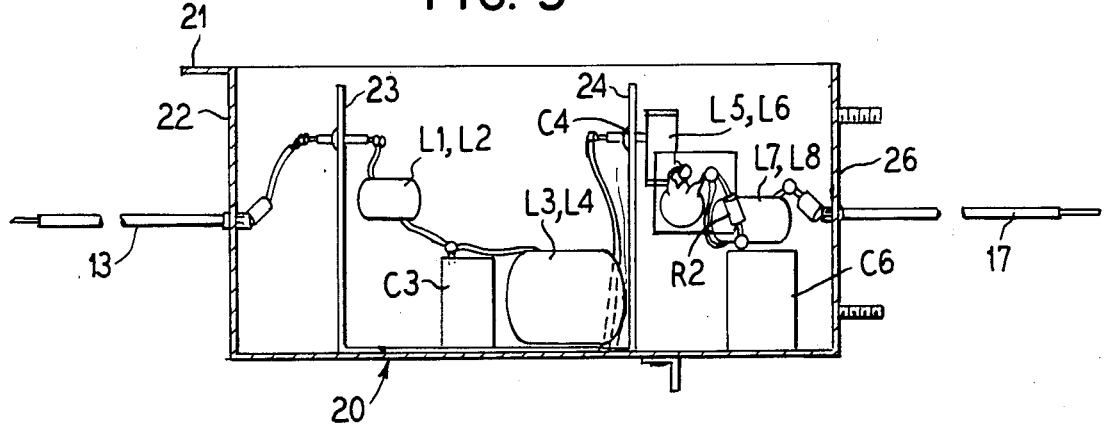
FIG. 3 is a partially cut-away view illustrating the container of the filter showing the internal compartments.

FIGS. 2 and 3 illustrate how the filter components are divided and mounted in separate compartments of a filter can 20. FIG. 2 is a top view and FIG. 3 is a side cut-away view illustrating the filter can 20 which has end walls 22 and 26 with the end wall 22 having a ledge 21 as illustrated. The leads 11 and 13 extend through the end wall 22 and are respectively connected to the capacitors C1 and C2 which are mounted in the compartment wall 23 which is electrically attached to the filter can 20. The capacitors C1 and C2 are connected to the inductors L1 and L2 and the capacitor C3 is connected across the inductors L1 and L2. The capacitor C3 is connected across the inductors L1 and L2 is illustrated and is connected to the inductors L3 and L4 which have their other sides connected to capacitors C4 and C5 which are feedthrough capacitors mounted in a partition wall 24 which is electrically connected to the filter can 20. The inductors L7, L8 as well as the resistor R2 and the capacitor C6 are mounted in the compartment between the partition wall 24 and end wall 26. The leads 16 and 17 extend through the end wall 26 and are connected to the inductors L7 and L8 as illustrated.

The partitions 23 and 24 provide grounding planes for the capacitors C1, C2 as well as capacitor C4 and C5. The filter can 20 is filled with a suitable encapsulating wax so as to cover the components and seal them.

The invention comprises an improved filter operable over very broad frequency range and although it has been described with respect to preferred embodiments, it is not to be so limited as changes and modifications may be made which are within the full intended scope as defined by the appended claims.

I claim as my invention:

1. A very broad band radio frequency interference filter for the range of 10 kilohertz to 1000 megahertz comprising, a pair of input lines, first and second capacitors, respectively, connected to said pair of input lines and connected together with their common lead grounded, first and second inductors wound on a first toroid core and having first ends respectively, connected to said first and second capacitors, a third capacitor and a first resistor connected in parallel and the combination connected from the second end said first inductor to the second end of said second inductor, third and fourth inductors wound on a second toroid core and having first ends respectively, connected to second ends of said first and second inductors, fourth and fifth capacitors, respectively connected together with their common terminal grounded and connected, respectively, to second ends of said third and fourth inductors, fifth and sixth inductors wound on a third toroid core and having first ends, respectively, connected to said fourth and fifth capacitors, a sixth capacitor, a second resistor connected in series with said sixth capacitor and the combination connected from the second end said fifth inductor to the second end of said sixth inductor, seventh and eighth capacitors connected together with their common lead grounded and connected, respectively, to the second ends of said fifth and sixth inductors, a pair of output terminals, and seventh and eighth inductors wound on a fourth toroid core and having first ends respectively connected to second ends of fifth and sixth inductors and the second ends of said seventh and eighth inductors, respectively, connected to said pair of output terminals.

2. A very broadband radio interference filter according to claim 1 including a filter can formed of electrically conducting material in which said first, second, third, fourth, fifth, sixth, seventh and eighth capacitors are mounted and in which said first, second, third, fourth, fifth, sixth, seventh and eighth inductors are mounted and in which said first and second resistors are mounted.

3. A very broadband radio interference filter according to claim 2 including first and second electrical conducting partitions mounted in said filter can and said first and second capacitors comprising feed through capacitors which extend through said first partition and said fourth and fifth capacitors comprising feed through capacitors which extend through said second partition.

4. A very broad band radio frequency interference filter according to claim 2 wherein an encapsulating material is poured into said filter can so as to encapsulate the filter components.

* * * * *